United States Patent (10) Patent No.: US 8,378,858 B2
Sadamori et al. (45) Date of Patent: Feb. 19, 2013

(54) ROTATIONALLY-OPERATED INPUT DEVICE

(75) Inventors: Hideto Sadamori, Okayama (JP);
Takumi Nishimoto, Okayama (JP); Jun Sato, Okayama (JP)

(73) Assignee: Panasonic Corporation, Osaka (JP)

( * ) Notice: Subject to any disclaimer, the term of this patent is extended or adjusted under 35 U.S.C. 154(b) by 1016 days.

(21) Appl. No.: 12/401,000

(22) Filed: Mar. 10, 2009

(65) Prior Publication Data

US 2009/0231168 A1 Sep. 17, 2009

(30) Foreign Application Priority Data

Mar. 12, 2008 (JP) ................................. 2008-062169

(51) Int. Cl.
*H03K 17/94* (2006.01)
*H03M 11/00* (2006.01)
*H01F 7/18* (2006.01)
*G09G 5/00* (2006.01)
*H01H 67/26* (2006.01)

(52) U.S. Cl. ........... 341/35; 335/228; 345/156; 200/179

(58) Field of Classification Search ............. 324/207.25; 335/228; 345/156
See application file for complete search history.

(56) References Cited

U.S. PATENT DOCUMENTS

| 6,642,824 | B2 * | 11/2003 | Oomkes ......................... 335/207 |
| 7,489,309 | B2 * | 2/2009 | Levin et al. .................... 345/184 |
| 7,860,237 | B2 * | 12/2010 | Takashima et al. ...... 379/433.06 |
| 8,130,123 | B2 * | 3/2012 | Inoue et al. ..................... 341/35 |
| 2007/0202935 | A1 * | 8/2007 | Won et al. ................... 455/575.4 |

FOREIGN PATENT DOCUMENTS

| JP | 2004-219297 | 8/2004 |
| JP | 2005-302654 | 10/2005 |

* cited by examiner

*Primary Examiner* — Benjamin C Lee
*Assistant Examiner* — Adam Carlson
(74) *Attorney, Agent, or Firm* — Wenderoth, Lind & Ponack, L.L.P.

(57) ABSTRACT

A rotationally-operated input device includes the following elements: (a) a magnetized cylindrical rotary magnet; (b) an operating shaft having the rotary magnet inserted and held thereon; (c) an upper case and a lower case for sandwiching the operating shaft therebetween rotatably; (d) an insulating substrate for fixing and holding the lower case; (e) a detection element mounted on the insulating substrate, for detecting rotation of the rotary magnet in a non-contact manner; and (f) a fixed magnet for generating an attractive and repulsive force between the fixed magnet and the rotary magnet. This structure allows detection of a rotation state of the operating shaft and provides click-feeling at rotating operation, in a non-contact manner. Thus a long-life small rotationally-operated input device can be provided.

7 Claims, 8 Drawing Sheets

ROTATIONALLY-OPERATED INPUT DEVICE

BACKGROUND OF THE INVENTION

1. Field of the Invention

The present invention relates to a rotationally-operated input device that is used for operating parts of various types of electronic device and outputs rectangular wave signals in response to rotating operation of the operating shaft thereof.

2. Background Art

In recent years, with the size and thickness reduction of various types of electronic device, such a device has had enhanced multi-functionality. Accordingly, an increasing number of rotationally-operated input devices are mounted on an insulating substrate to be rotated in parallel with the surface of the insulating substrate. Such a conventional rotationally-operated input device is described with reference to FIGS. 8 through 10.

FIG. 8 is a sectional view of a conventional rotationally-operated input device. FIG. 9 is an exploded perspective view of the conventional rotationally-operated input device. FIG. 10 is a diagram showing a circular recess in a contact case of the conventional rotationally-operated input device. With reference to FIGS. 8 through 10, contact case 10 made of an insulating resin has circular recess 11 open to the front face thereof. Cylindrical protrusion 12 is formed at the center of the bottom face of circular recess 11. At the center of cylindrical protrusion 12, bearing hole 13 is provided. Along the outer periphery of cylindrical protrusion 12, common electrode 20 is exposed. Outside of common electrode 20, signal electrodes 30 and 40 are insert-molded in an exposed state.

Common electrode 20 is exposed in a semi-circular ring shape. Extension 22 extending from the intermediate position of the semi-circular shape connects common electrode 20 to common terminal 21 that projects downwardly from the outer peripheral wall forming circular recess 11 of contact case 10. As shown in FIG. 10, signal electrodes 30 are formed in a position on the left side of extension 22 of common electrode 20, in an angular range of approximately a half the angular range of exposed common electrode 20. The plurality of signal electrodes 30 is exposed radially with respect to the center of cylindrical protrusion 12 to form A-phase signal electrodes. Signal electrodes 40 are formed in a position on the right side of extension 22 of common electrode 20, in an angular range of approximately a half the angular range of exposed common electrode 20. The plurality of signal electrodes 40 is exposed radially with respect to the center of cylindrical protrusion 12 to form B-phase signal electrodes. A-phase signal terminal 31 connecting to A-phase signal electrodes 30 and B-phase signal terminal 41 connecting to B-phase signal electrodes 40 extend downwardly from the outer peripheral wall and project from contact case 10 so as to sandwich common electrode 21 therebetween.

In operating shaft 50 made of an insulating resin, flange 52 is formed on the rear side of linear rod-like cylindrical part 51. Slider 60 is attached to flange 52 and slides on common electrode 20 and signal electrodes 30 and 40 of contact case 10 by rotating operation. At the center of flange 52, support 53 is projected. Support 53 is inserted and held in bearing hole 13 of contact case 10.

Bearing 70 has a fitting hole into which cylindrical part 51 of operating shaft 50 is inserted. The bearing is fixed to contact case 10 so as to include flange 52 therein and block circular recess 11 of contact case 10 from the front side thereof. Click spring 80 made of a resilient metal plate is fixed to bearing 70 on the side of contact case 10. A dowel at the tip of the resilient arm of the click spring is in resilient contact with projections and depressions provided on flange 52 of operating shaft 50.

Common electrode 20 and signal electrodes 30 and 40 are disposed on the bottom face of circular recess 11 of contact case 10 in a small angular range so as to reduce sliding abrasion and improve the durability of slider 60.

The rotationally-operated input device structured above is mounted on an insulating substrate (not shown) and an operating knob is attached to operating shaft 50. This rotationally-operated input device is rotated in parallel with the surface of the insulating substrate. A description of the operation thereof is provided hereinafter.

Rotation of operating shaft 50 causes slider 60 to slide on common electrode 20 and signal electrodes 30 and 40. This operation brings common electrode 20 and A-phase signal electrodes 30 into and out of electrical contact with each other via slider 60. Thus a rectangular wave signal is supplied between common terminal 21 and A-phase signal terminal 31. Similarly, this operation brings common electrode 20 and B-phase signal electrodes 40 into and out of electrical contact with each other via slider 60. Thus a rectangular wave signal is supplied between common terminal 21 and B-phase signal terminal 41.

A-phase signal electrodes 30 and B-phase signal electrodes 40 are displaced at a predetermined angle in the rotation direction of slider 60. Thus the A-phase rectangular wave signal and the B-phase rectangular wave signal are supplied with a phase difference. Therefore, according to the output state of the A-phase rectangular wave signal and the B-phase rectangular wave signal, a direction and amount of rotation can be detected. According to the detection, the function of the electronic device incorporating the input device is controlled.

For example, Patent Document 1 and Patent Document 2 are known as the information about conventional arts related to this invention.

[Patent Document 1] Japanese Patent Unexamined Publication No. 2004-219297

[Patent Document 2] Japanese Patent Unexamined Publication No. 2005-302654

However, with miniaturization and multi-functionality enhancement of electronic devices represented by a portable telephone, a rotationally-operated input device is requested to have a smaller mounting height and improved durability. For the above conventional rotationally-operated input device, slider 60 slides on common electrode 20 and signal electrodes 30 and 40 in a smaller angular range, but abrasion of slider 60 sliding on respective electrodes 20, 30, and 40 cannot be prevented. Thus there are limitations in increasing the life and reducing the height in the mounting state.

SUMMARY OF THE INVENTION

The present invention provides a long-life small rotationally-operated input device that is operable in parallel with the surface of an insulating substrate and has enhanced operating durability. The rotationally-operated input device includes the following elements:

a) a magnetized cylindrical rotary magnet;

b) an operating shaft having the rotary magnet inserted and held at an intermediate portion thereof, and having an operating part at one end thereof;

c) an upper case and a lower case for sandwiching the operating shaft therebetween rotatably;

d) an insulating substrate for fixing and holding the lower case;

e) a detection element mounted on the insulating substrate, for detecting rotation of the rotary magnet in a non-contact manner; and f) a fixed magnet attached to one of the lower case and the upper case, for generating an attractive and repulsive force between the fixed magnet and the rotary magnet.

In this structure, the operating direction of the rotationally-operated input device is in parallel with the surface of the insulating substrate on which the input device is mounted, and a rotation state can be detected in a non-contact manner. Further, click-feeling generated by the attractive and repulsive force between the rotary magnet and the fixed magnet can be obtained in a non-contact structure. Thus a long-life small rotationally-operated input device having excellent operating durability can be implemented.

DETAILED DESCRIPTION OF THE INVENTION

Hereinafter, a description of an exemplary embodiment of the present invention is provided with reference to FIGS. 1 through 7.

Embodiment

Figure 1:
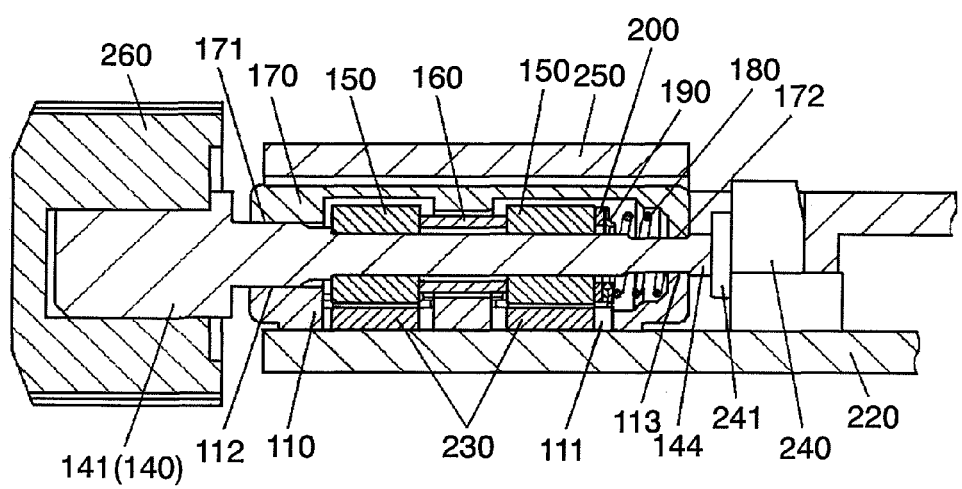
FIG. 1 is a sectional view of a rotationally-operated input device in accordance with an exemplary embodiment of the present invention.
Figure 2:
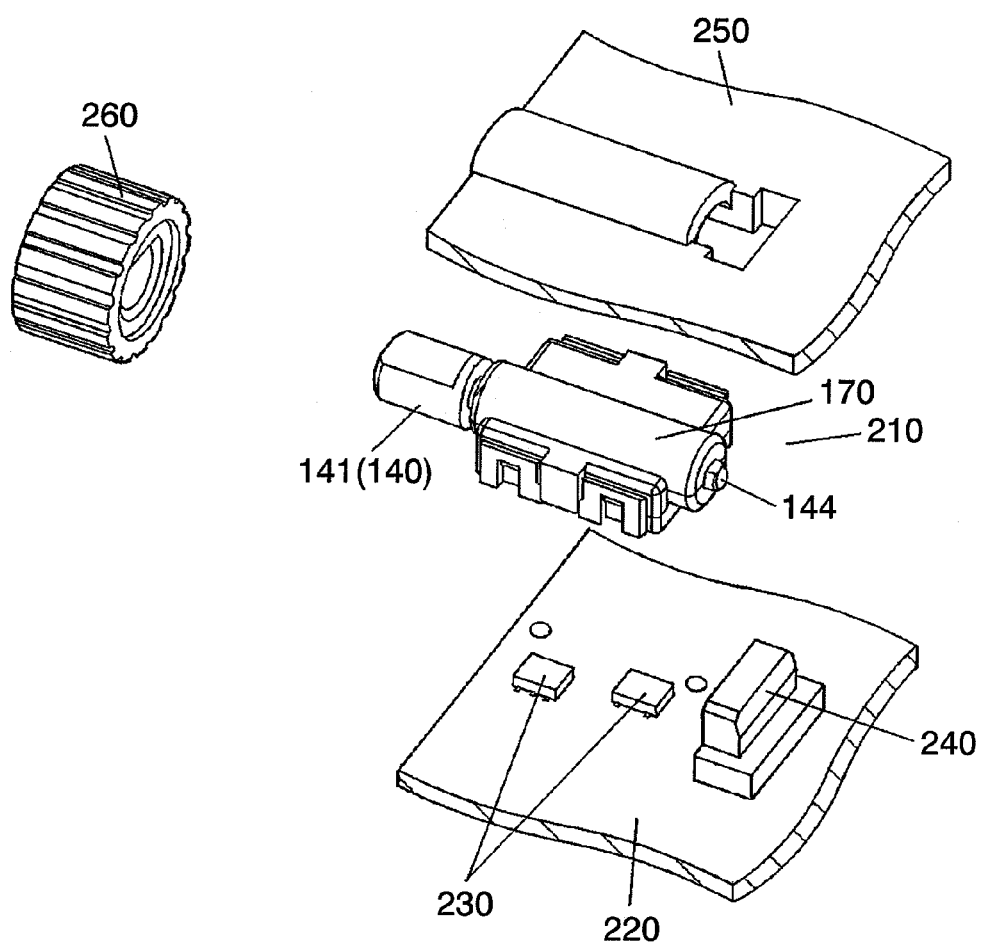
FIG. 2 is an exploded perspective view of the rotationally-operated input device in accordance with the exemplary embodiment.
Figure 3:
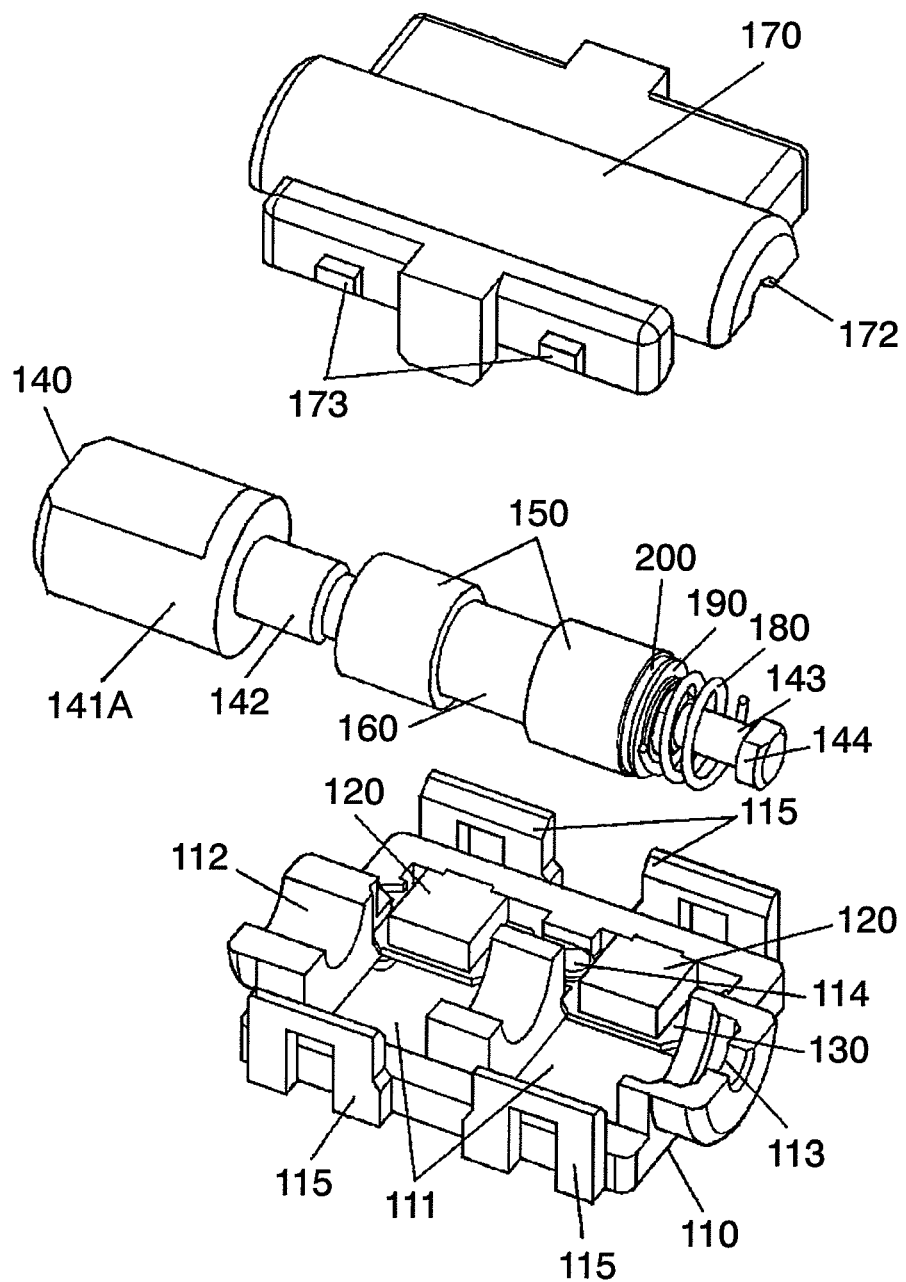
FIG. 3 is an exploded perspective view of an input device workpiece of the rotationally-operated input device in accordance with the exemplary embodiment.
Figure 4:
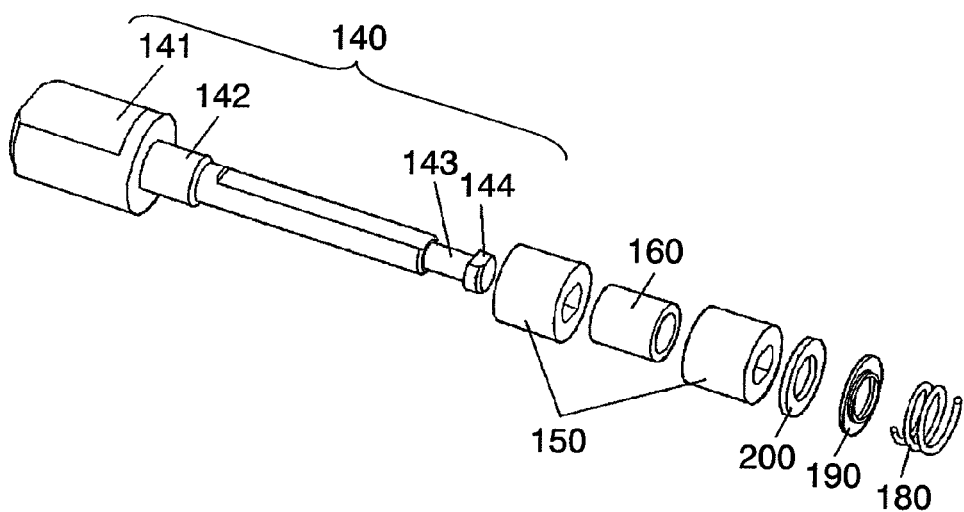
FIG. 4 is an exploded perspective view of an operating shaft combination of the rotationally-operated input device in accordance with the exemplary embodiment.
Figure 5:
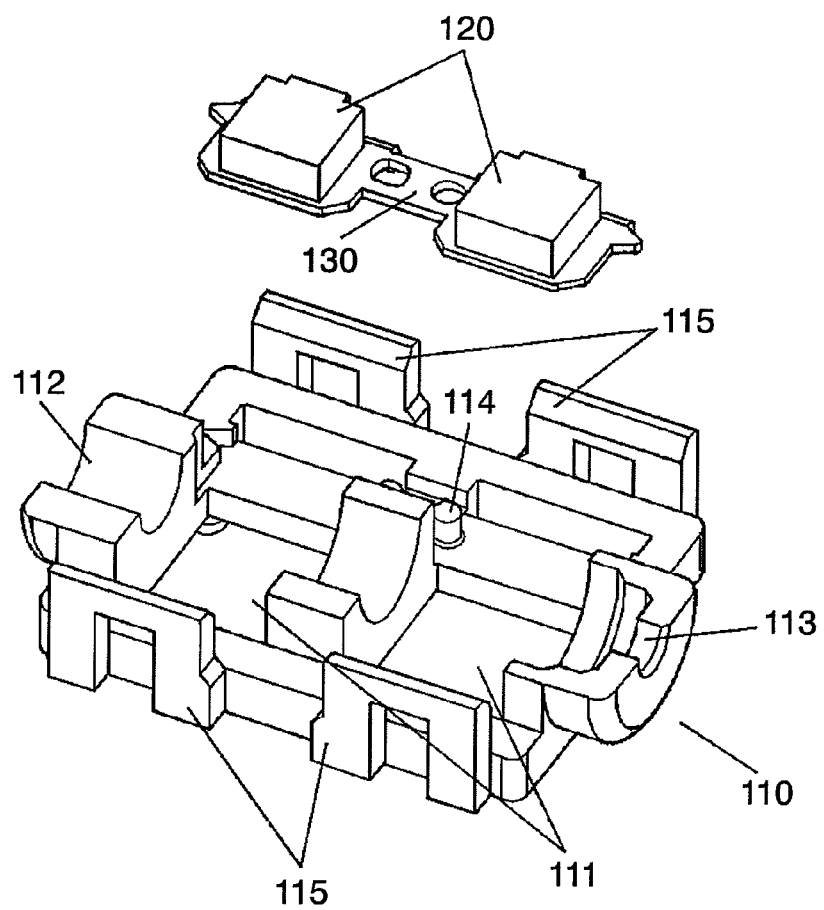
FIG. 5 is a perspective view showing a combination of a lower case and fixed magnets of the rotationally-operated input device in accordance with the exemplary embodiment.

FIG. 1 is a sectional view of a rotationally-operated input device in accordance with the exemplary embodiment of the present invention. FIG. 2 is an exploded perspective view of the rotationally-operated input device in accordance with the exemplary embodiment. FIG. 3 is an exploded perspective view of an input device workpiece of the rotationally-operated input device in accordance with the exemplary embodiment. FIG. 4 is an exploded perspective view of an operating shaft combination of the rotationally-operated input device in accordance with the exemplary embodiment. FIG. 5 is a perspective view showing a combination of a lower case and fixed magnets of the rotationally-operated input device in accordance with the exemplary embodiment.

Lower case 110 is made of a frame-shaped insulating resin that has two rectangular through holes 111. Semi-circular concave lower bearing parts 112 and 113 having the same central axis are disposed on the top faces at the intermediate portions of two facing sides of lower case 110 in the juxtaposition direction of two rectangular holes 111. On the bottom face at the central position of one of the remaining two sides, two caulking projections 114 are provided. Two identical fixed magnets 120 in a rectangular parallelepiped shape are mounted on planar magnet mount 130 made of stainless steel. Caulking projections 114 are caulked so that magnet mount 130 is fixed into lower case 110 and each fixed magnet 120 is disposed in lower case 110. Fixed magnets 120 are positioned adjacent to corresponding rectangular holes 111 in lower case 110. Two fixed magnets 120 have the magnetic poles of the same polarity on the surfaces facing the central axis line of lower bearing parts 112 and 113 of lower case 110, and are magnetized in the same magnetic direction.

In linear rod-like operating shaft 140, operating part 141 is formed at one end and pressing part 144 is formed at the other end. Circular fitting parts 142 and 143 are disposed between operating part 141 and pressing part 144 so as to correspond to lower bearing parts 112 and 113, respectively, of lower case 110. Between fitting parts 142 and 143, two identical cylindrical rotary magnets 150, each having a substantially oval through-hole and magnetized to have a plurality of magnetic poles in the peripheral direction thereof, are inserted and fixed so as to have the same angular relation. The portions of operating shaft 140 combined with rotary magnets 150 are formed to have the substantially oval shapes identical with those of the through-holes of rotary magnets 150. Operating shaft 140 is fixed to rotary magnets 150 in a press fit state without any rattling so that rotary magnets 150 rotate integrally with operating shaft 140 when the operating shaft is rotated. With operating shaft 140 supported by lower case 110, two rotary magnets 150 are positioned so as to correspond to two rectangular holes 111 in lower case 110. In order to keep a predetermined space between rotary magnets 150, cylindrical spacer 160 is interposed between two rotary magnets 150 on operating shaft 140. The following descriptions are provided for a structure in which each of rotary magnets 150 is magnetized to have N magnetic poles and S magnetic poles alternately arranged at the same angle.

In upper case 170 opened in the downward direction and made of an insulating resin, upper bearing parts 171 and 172 having the same central axis and a semi-circular concave shape are provided to form pairs with lower bearing parts 112 and 113, respectively, of lower case 110.

These upper bearing parts 171 and 172 and lower bearing parts 112 and 113 fittingly support fitting parts 142 and 143 of operating shaft 140 so that the operating shaft can be rotated and pressed in the axial direction. Engagement parts 115 in four positions in lower case 110 are engaged to engaging protrusions 173 in four positions in upper case 170. Thus upper case 170 and lower case 110 are combined into one unit.

In operating shaft 140 fittingly supported by upper case 170 and lower case 110, operating part 141 at one end and pressing part 144 at the other end project from upper case 170 and lower case 110. Operating part 141 is formed to have a diameter larger than that of fitting part 142. Pressing part 144 is formed to have a diameter larger than that of fitting part 143. This structure also works to prevent inadvertent disconnection of operating shaft 140.

In the space formed by upper case 170 and lower case 110, coil spring 180 for urging operating shaft 140 toward the side of operating part 141 is incorporated between pressing part 144 of operating shaft 140 and rotary magnet 150. The action of this coil spring 180 allows pressing part 144 at the other end to be kept in contact with the outer wall surfaces of upper case 170 and lower case 110. This structure prevents axial rattling of operating shaft 140 caused by the combination of the plurality of members, thus ensuring high quality.

Between coil spring 180 and rotary magnet 150, washer 190 is disposed on the end face side of coil spring 180, and bearing plate 200 in a flat ring shape is disposed on the side of rotary magnet 150 in combination with the washer. Washer 190 and bearing plate 200 prevent the end face of coil spring 180 from direct contact with rotary magnet 150, thus preventing degradation of rotating feeling of operating shaft 140.

Input device workpiece 210 can be transported and stored in a state in which upper case 170 and lower case 110 are combined into one unit so that operating shaft 140 can be rotated and pressed in the axial direction.

On the top face of insulating substrate 220, two identical Hall ICs 230 and push-on switch 240 are mounted. Each of the Hall ICs detects changes in flux density as a detection element. Push-on switch 240 is operated by application of a pressing force to drive part 241 thereof from the front side toward the rear side, and generates an ON signal. When the pressing force is released, the switch self-restores to an OFF state before the pressing operation.

On insulating substrate 220, input device workpiece 210 is positioned by a positioning dowel (not shown) projecting downwardly from lower case 110. Further, cover plate 250 is disposed over input device workpiece 210 to fix input device workpiece 210 onto insulating substrate 220. In this state, input device workpiece 210 is mounted on insulating substrate 220. Cover plate 250 may be formed of the case (not shown) of an electronic device incorporating the input device, or may also serve as another component of the electronic device. In the state in which input device workpiece 210 is mounted on insulating substrate 220, two Hall ICs 230 on insulating substrate 220 are housed in two rectangular holes 111 in lower case 110.

In the state in which input device workpiece 210 is positioned on insulating substrate 220, operating part 141 of operating shaft 140 projects from the end of insulating substrate 220. Operating knob 260 is fitted onto operating part 141. The tip of pressing part 144 projecting from upper case 170 and lower case 110 on the opposite side of operating part 141 is in contact with drive part 241 of push-on switch 240. Two Hall ICs 230 are in non-contact proximity to two rotary magnets 150 inserted and fixed onto operating shaft 140. Two Hall ICs 230 are mounted on insulating substrate 220 so as to be aligned at slightly different positions with each other at a predetermined angle with respect to rotary magnets 150 in order to induce phase difference.

The rotationally-operated input device of this exemplary embodiment is structured as above. Next, the operation thereof is described.

In an inoperative state in which operating knob 260 is not operated, operating shaft 140 is in a stable stop state in which the magnetic poles of opposite polarity are positioned in proximity to each other and the maximum attractive force is generated between corresponding rotary magnets 150 and fixed magnets 120.

Next, operating knob 260 is rotated so that operating shaft 140 is rotated with a rotating force exceeding the attractive force between rotary magnets 150 integral with operating shaft 140 and fixed magnets 120. With this rotation, the magnetic poles of rotary magnet 150 attracting fixed magnet 120 leaves the fixed magnet and another one of the magnetic poles repulsing fixed magnet 120 approaches fixed magnet 120. Thus repulsive force for restraining the rotation increases. However, when the operating shaft is rotated with a force larger than the repulsive force applied to operating knob 260, operating shaft 140 is further rotated in the same rotation direction against the repulsive force between fixed magnet 120 and rotary magnet 150. As a result, another one of the magnetic poles generating the attractive force toward fixed magnet 120 approaches and the rotating force is applied to operating shaft 140.

In this manner, rotating operation of rotary magnets 150 on operating shaft 140 via operating knob 260 in the same direction causes attractive force and repulsive force to be alternately generated between the magnetic poles of rotary magnets 150 and fixed magnets 120 fixed to lower case 110. Thus smooth and light click-feeling can be provided in a non-contact structure.

Stopping the rotating operation of operating knob 260 brings operating shaft 140 into the stable stop state in which the magnetic poles of opposite polarity attract each other between fixed magnets 120 and rotary magnets 150.

When rotary magnets 150 are rotated by rotation of operating knob 260, Hall ICs 230 mounted on insulating substrate 220 detect changes in the magnetic flux from the magnetic poles arranged in the peripheral direction of rotary magnets 150 and output predetermined rectangular wave signals. Further, two Hall ICs 230 are aligned at slightly different positions with each other to provide a predetermined phase difference. Thus the rectangular wave signals supplied according to the changes in the magnetic flux caused by rotation of rotary magnets 150 have a phase difference. According to this phase-difference output, a direction and amount of the rotation can be obtained. These rectangular wave signals can also be provided in a non-contact manner. Thus a rotationally-operated input device having a long life and improved durability can be provided.

When operating knob 260 is rotated in the reverse direction, the attractive and repulsive force generated between rotary magnets 150 and fixed magnets 120 can provide click-feeling in the same operation as described above. In this case, pulse signals from two Hall ICs 230 provide output having a phase difference in the reverse direction. Thus the direction and amount of the rotation can be obtained.

In this manner, in accordance with this exemplary embodiment, a large rotation diameter need not be ensured for a rotationally-operated input device operable in parallel with the surface of insulating substrate 220. Such a large rotation diameter need be ensured for slider 60 that rotates in a plane orthogonal to operating shaft 50 in the conventional structure. The rotationally-operated input device of this exemplary embodiment only requires a space for allowing the rotation of cylindrical rotary magnets 150 fixed to operating shaft 140. With this structure, a small rotationally-operated input device having a reduced height from the surface of insulating substrate 220 can be implemented.

Next, operating knob 260 is pressed toward the rear side of the axial direction with a pressing force exceeding the urging force of coil spring 180 for urging operating shaft 140 toward the front side. While operating shaft 140 is compressing coil spring 180 disposed on the rear side, pressing part 144 at the other end presses drive part 241 of push-on switch 240. As a result, push-on switch 240 operates and generates the ON signal. When the pressing force is released, the resilient force of coil spring 180 and the self-restoring force of drive part 241 of push-on switch 240 return operating shaft 140 to the position in the inoperative state of FIG. 1. Then, push-on switch 240 also returns to the OFF state.

Figure 6:
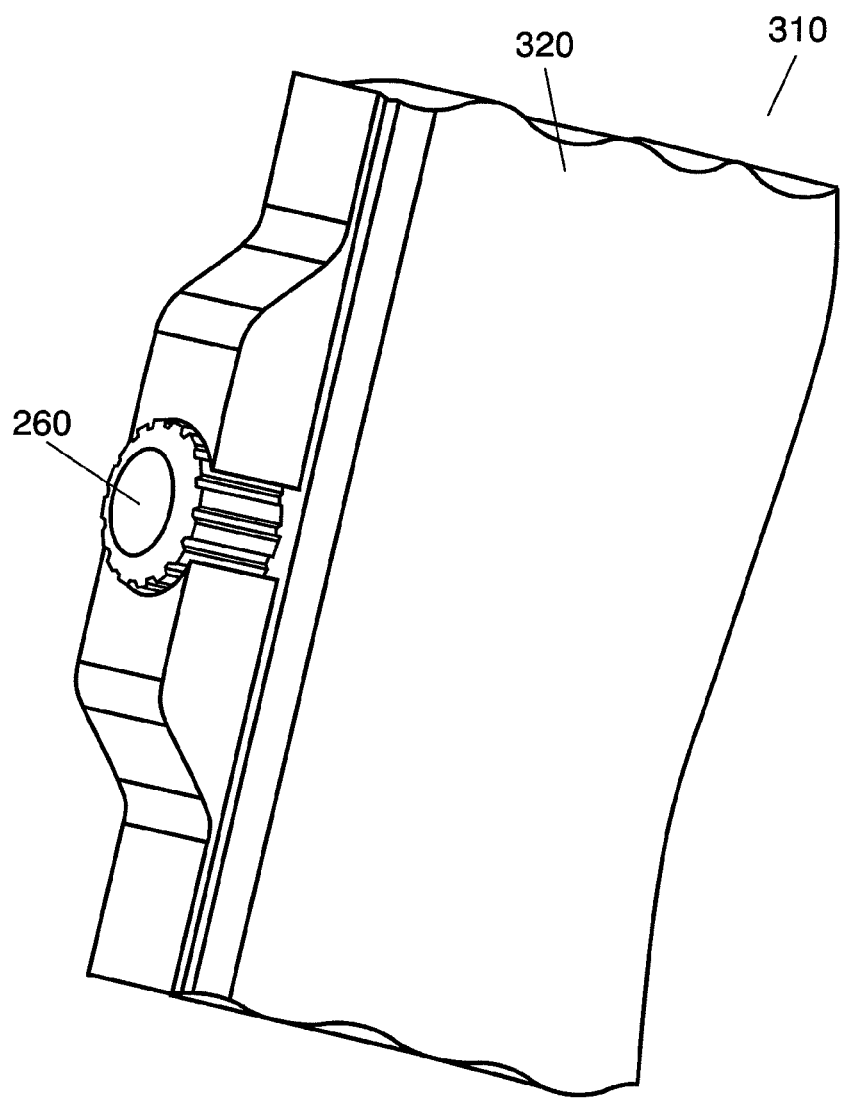
FIG. 6 is a partial outside view of a portable telephone incorporating the rotationally-operated input device in accordance with the exemplary embodiment.

Next, a description of incorporation of the rotationally-operated input device of this exemplary embodiment into an electronic device is provided. FIG. 6 is a partial outside view of a portable telephone incorporating the rotationally-operated input device in accordance with the exemplary embodiment of the present invention. As shown in FIG. 6, the rotationally-operated input device is incorporated into and used in portable telephone 310 so that the outer peripheral side face of cylindrical operating knob 260 can be rotated and operating knob 260 can also be pressed, for example. Operating knob 260 is rotated by application of a force in a tangential direction of the outer peripheral side face. In response to the phase-difference rectangular wave signals obtained by the rotating operation, an assigned function is operated. For example, a function of scrolling a registered telephone number list shown on display 320 is operated. While a desired telephone number is displayed, pressing operating knob 260 one time operates push-on switch 240, and in response to the generated ON signal, the selected telephone number is determined. Pressing operating knob 260 one time again causes the selected telephone number to be dialed. Such functions are implemented via software. Functions other than described above may be assigned. The rotationally-operated input device may be incorporated into an electronic device other than portable telephone 310.

In this manner, in accordance with this exemplary embodiment, operation in parallel with the surface of insulating substrate 220 is possible. Further, a small rotationally-operated input device can be implemented so that rotation of operating shaft 140 allows phase-difference rectangular wave signals to be supplied and pressing operation thereof allows a signal for turning on the switch to be generated.

Because coil spring 180 urges operating shaft 140 toward the side of operating knob 260, operating shaft 140 returns when the pressing operation is released. This return operation is securely achieved even without operating knob 260 attached. Further, because this coil spring 180 urges operating shaft 140 toward operating part 141, rattling of operating shaft 140 caused by the combination of the members can be prevented. Thus, even in a structure without push-on switch 240, installation of coil spring 180 is preferable.

Further, in accordance with this exemplary embodiment, a rotation state of operating shaft 140 can be detected, according to the output of the rectangular wave signals based on the changes in the magnetic flux from rotary magnets 150 and supplied from Hall ICs 230. Further, smooth click-feeling given by the attractive and repulsive force between rotary magnets 150 and fixed magnets 120 can be obtained with a non-contact structure. Thus a small rotationally-operated input device having improved durability and a long life can be implemented.

Figure 7:
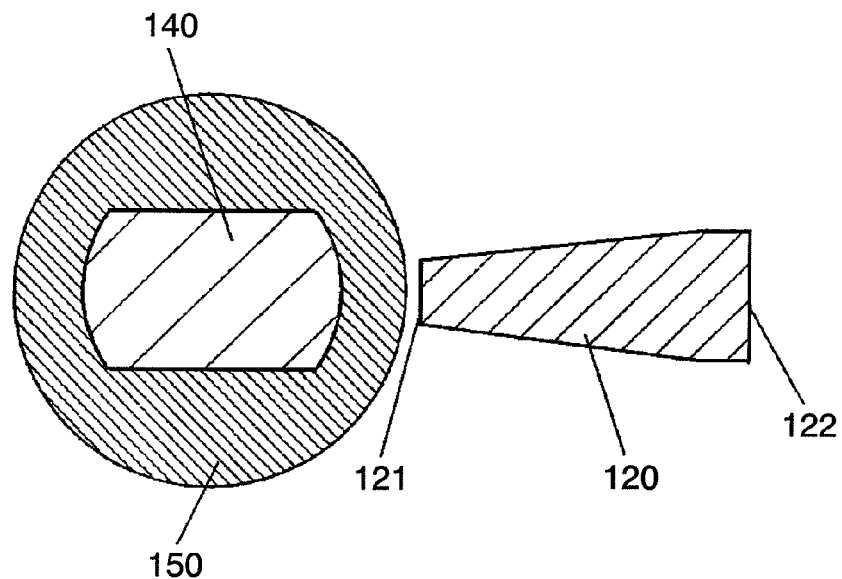
FIG. 7 is a conceptual drawing showing a relative position of rotary magnets and the fixed magnets of the rotationally-operated input device in accordance with the exemplary embodiment.
Figure 8:
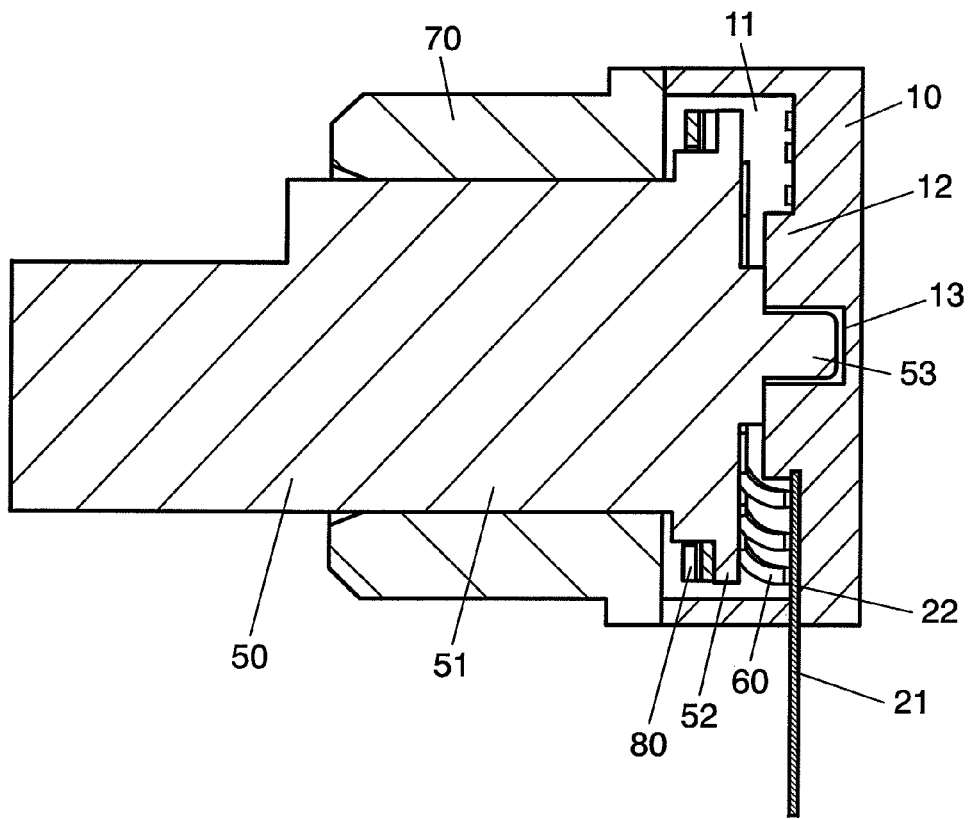
FIG. 8 is a sectional view of a conventional rotationally-operated input device.
Figure 9:
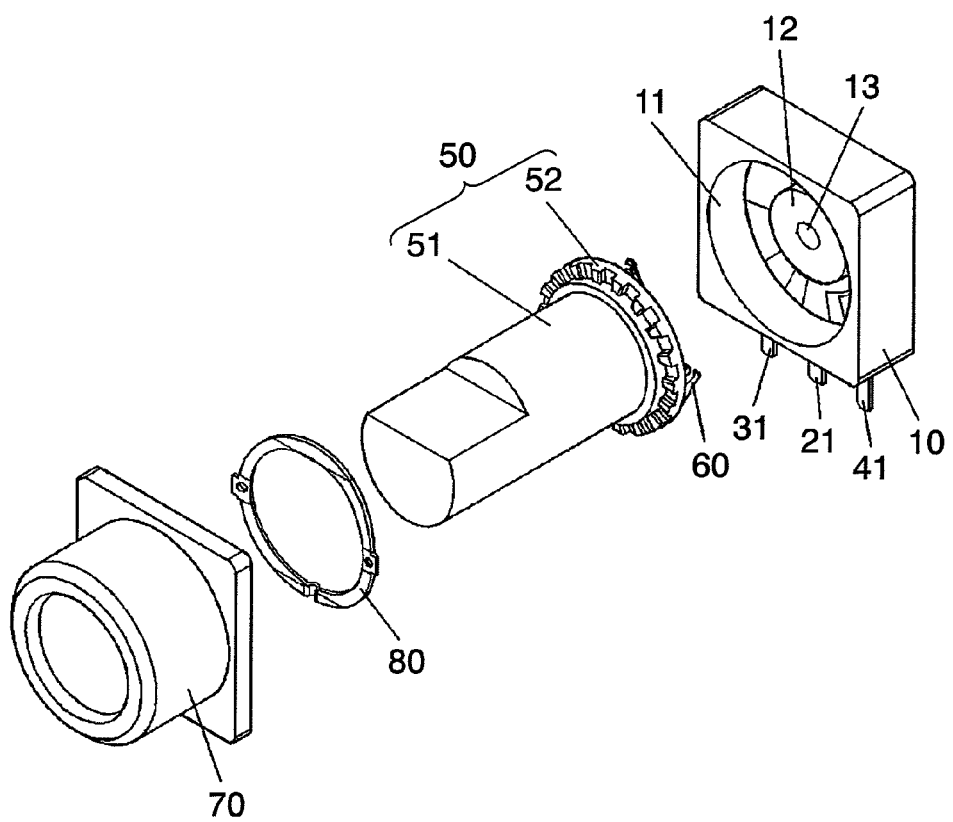
FIG. 9 is an exploded perspective view of the conventional rotationally-operated input device.
Figure 10:
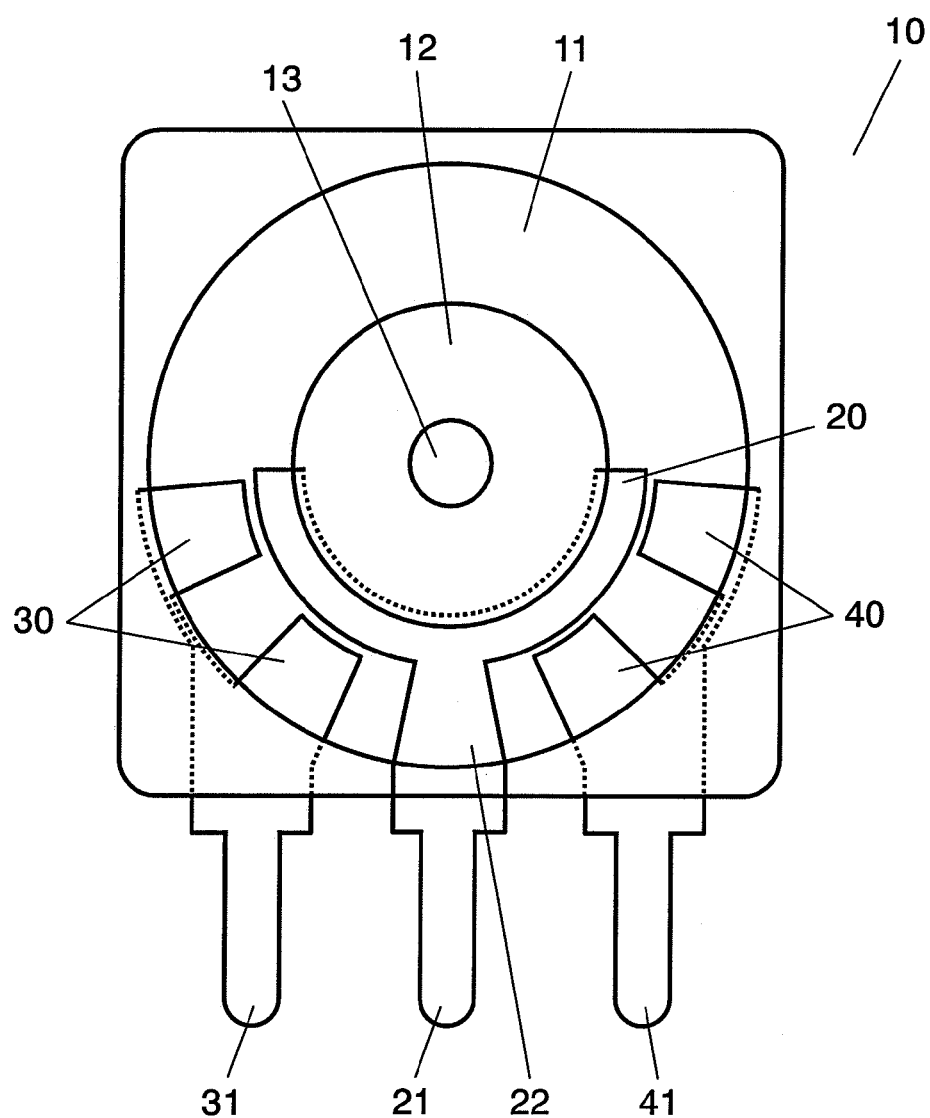
FIG. 10 is a diagram showing a circular recess in a contact case of the conventional rotationally-operated input device.

A structure in which the rotary magnets and the fixed magnets are arranged in the relative position as shown in FIG. 7 can increase the attractive and repulsive force between the corresponding magnets, thus providing large click-feeling. FIG. 7 shows a section in the direction orthogonal to the axis line of operating shaft 140. Rotary magnets 150 are fixed to operating shaft 140. Each of rotary magnets 150 is magnetized to have magnetic poles of opposite polarity arranged alternately at a predetermined angle, similar to the above case.

Fixed magnet 120 is disposed in a confronting state in which one of pole faces 121 is in proximity to rotary magnet 150. Pole face 121 is disposed to orthogonally intersect a virtual plane from the rotation central axis of rotary magnet 150 that passes through the rotation central axis and extends toward the radial outer periphery of the rotary magnet. In other words, pole face 121 of fixed magnet 120 and rotary magnet 150 are disposed so that a virtual perpendicular line from the central position of pole face 121 in proximity to rotary magnet 150 perpendicularly intersects the rotation central axis of rotary magnet 150. This arrangement allows the pole face of rotary magnet 150 and the pole face of fixed magnet 120 to face each other, thus concentrating the magnetic flux and enhancing the action thereof. As a result, the attractive and repulsive force between the magnets can be increased.

More preferably, as shown in FIG. 7, fixed magnet 120 is formed so that the area of pole face 121 on the side nearer to rotary magnet 150 is reduced uniformly with respect to the central position thereof and is smaller than the area of pole face 122 on the side farther from the rotary magnet. This structure concentrates the magnetic flux on the side of the smaller area in fixed magnet 120, thus increasing the attractive and repulsive force.

In the descriptions of this exemplary embodiment, two rotary magnets 150 and two fixed magnets 120 are disposed so as to correspond to each other. However, in order to provide click-feeling, at least one fixed magnet may be used. According to the magnitude of click-feeling or magnetic force, the number of the fixed magnets can be selected. Further, the number of the rotary magnets may be only one. In this case, two Hall ICs 230 only need be aligned at slightly different positions so that the changes in the magnetic flux from the one rotary magnet can be detected.

In this exemplary embodiment, rotary magnets 150 is magnetized to have N magnetic poles and S magnetic poles alternately arranged at a predetermined angle on the outer peripheral side thereof. However, the rotary magnet may be magnetized to have either one of the poles on the outer peripheral side. In this case, the shape or operation of the rotary magnet is changed to vary the magnetic flux. Fixed magnets 120 may be disposed on the side of upper case 170. The component operable by pressing operation in the axial direction of operating shaft 140 is not limited to push-on switch 240. Another type of switch may be used.

In this exemplary embodiment, rectangular holes 111 for Hall ICs 230 are provided in lower case 110, and rotary magnets 150 correspond to Hall ICs 230 via rectangular holes 111. This structure allows each component to be disposed at an advantageous height, within a compact position area, and thus is preferable. However, Hall ICs 230 only need be disposed in a position in which a rotation state of rotary magnets 150 can be detected. In other words, in some arrangements, rectangular holes 111 are not necessary.

Instead of Hall ICs 230, a magnetic sensor capable of detecting magnetic changes may be used.

As described above, the rotationally-operated input device of the present invention is operable in parallel with the surface of the insulating substrate, and is capable of detecting a rotation state thereof and providing click-feeling, in a non-contact structure. Thus a long-life small rotationally-operated input device having improved operating durability can be provided. The present invention is useful for an operating part or the like of various types of electronic device.

In accordance with the present invention, the operating shaft is sandwiched between the lower bearing part of the lower case and the upper bearing part of the upper case so that the operating shaft is rotatable and operable in the axial direction thereof. Further, a switch operable by pressing operation of the operating shaft at the other end in the axial direction thereof is provided. With this structure, the present invention can provide a rotationally-operated input device operable by rotating operation and pressing operation and capable of providing output corresponding to the operations. As a result, various functions can be assigned to an electronic device incorporating the rotationally-operated input device.

In accordance with the present invention, the operating shaft has a spring operative to urge the operating shaft toward the side of the operating part in the axial direction thereof. This structure can prevent axial rattling of the operating shaft caused by the combination of members, thus ensuring high quality. In a case where a switch operable by the pressing operation of the operating shaft is provided, this structure ensures the returning operation of the operating shaft when the pressing operation of the switch is released.

In accordance with the present invention, the fixed magnet is disposed in a confronting state in which one of the pole faces thereof is in proximity to the rotary magnet. Further, the pole face is disposed to orthogonally intersect the virtual plane from the rotation central axis of the rotary magnet that passes through the rotation central axis and extends toward the radial outer periphery of the rotary magnet. This arrangement can increase the attractive and repulsive force generated between the rotary magnet and the fixed magnet.

In accordance with the present invention, the fixed magnet is disposed so that one of the pole faces is in proximity to the rotary magnet. The area of the pole face in proximity to the rotary magnet is smaller than the area of the other pole face of the fixed magnet. This structure can concentrate the magnetic flux of the fixed magnet on the side in proximity to the rotary magnet, thus increasing the attractive and repulsive force.

What is claimed is:

1. A rotationally-operated input device comprising:
a magnetized rotary magnet;
an operating shaft having the rotary magnet inserted in a portion thereof, and having a manually operating part at one end thereof;
a case for supporting the operating shaft rotatably;
a detection element arranged so as to face the rotary magnet, for detecting rotation of the rotary magnet in a non-contact manner for providing a user selection by way of shaft rotation by operating the operating part; and
a fixed magnet arranged so as to face the rotary magnet in a non-contact manner,
wherein the rotary magnet has alternately arranged N and S magnetic poles in a cross section in a direction orthogonal to an axis of the operating shaft,
wherein a face of the fixed magnet which is closest to the rotary magnet is only one pole face of the fixed magnet,
and wherein arrangement of the fixed magnet and rotary magnet provides a detent feedback to the user during operation of said operating part by creating attraction and repulsion between the magnets based on alignment or misalignment of the particular relative magnetic poles of the two magnets.

2. The rotationally-operated input device of claim 1, further comprising:
a switch operable by a pressing operation of the operating shaft at another end of the operating shaft in an axial direction thereof, wherein the operating shaft is operable in the axial direction thereof.

3. The rotationally-operated input device of claim 1, further comprising:
a spring operative to urge the operating shaft toward a side of the operating part in an axial direction of the operating shaft.

4. The rotationally-operated input device of claim 1, wherein
the only one pole face is disposed to orthogonally intersect a virtual plane from a rotation central axis of the rotary magnet that passes through the rotation central axis and extends toward a radial outer periphery of the rotary magnet.

5. The rotationally-operated input device of claim 1, wherein
an area of the only one pole face facing the rotary magnet is smaller than an area of another pole face of the fixed magnet.

6. The rotationally-operated input device of claim 1, wherein the detection element includes two Hall ICs aligned at different positions with each other at a predetermined angle with respect to the rotary magnet.

7. A rotationally-operated input device comprising:
a magnetized rotary magnet;
an operating shaft having the rotary magnet inserted in a portion thereof, and having a manually operating part at one end thereof;
a case for supporting the operating shaft rotatably;
a detection element arranged so as to face the rotary magnet, for detecting rotation of the rotary magnet in a non-contact manner for providing a user selection by way of shaft rotation by operating the operating part; and
a fixed magnet arranged so as to face the rotary magnet in a non-contact manner,
wherein the rotary magnet has alternately arranged N and S magnetic poles in a cross section in a direction orthogonal to an axis of the operating shaft,
wherein the fixed magnet is arranged such that a virtual perpendicular line from a central position of one pole face of the fixed magnet which is closest to the rotary magnet intersects the rotary magnet,
and wherein arrangement of the fixed magnet and rotary magnet provides a detent feedback to the user during operation of said operating part by creating attraction and repulsion between the magnets based on alignment or misalignment of the particular relative magnetic poles of the two magnets.

* * * * *